US012727433B2

(12) United States Patent
Garcia et al.

(10) Patent No.: US 12,727,433 B2
(45) Date of Patent: Sep. 1, 2026

(54) MODELING SUBSTRATE TEMPERATURES

(71) Applicant: Applied Materials, Inc., Santa Clara, CA (US)

(72) Inventors: Alvaro Garcia, Mountain View, CA (US); Tony Jefferson Gnanaprakasa, Mountain View, CA (US); Sankaranarayanan Ravi, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 18/606,627

(22) Filed: Mar. 15, 2024

(65) Prior Publication Data

US 2025/0293069 A1 Sep. 18, 2025

(51) Int. Cl.

| | |
|---|---|
| ***H10P 72/72*** | (2026.01) |
| ***H10P 72/00*** | (2026.01) |
| ***H10P 72/76*** | (2026.01) |

(52) U.S. Cl.

CPC ........ *H10P 72/722* (2026.01); *H10P 72/0602* (2026.01); *H10P 72/7624* (2026.01)

(58) Field of Classification Search

CPC ............... H10P 72/722; H10P 72/0602; H10P 72/7624; H01L 21/67109; H01L 21/6833; H01L 21/68785

See application file for complete search history.

(56) References Cited

U.S. PATENT DOCUMENTS 8,425,791 B2 * 4/2013 Koshimizu ....... H01J 37/32522 216/61

2006/0158207 A1 7/2006 Reitinger

2007/0139856 A1 6/2007 Holland et al.

2017/0215230 A1 * 7/2017 Parkhe ................. H05B 1/0233

2017/0372928 A1 * 12/2017 Yamada ............... H05B 1/0233

2019/0371577 A1 * 12/2019 Benjaminson .... H01L 21/68735

2021/0132575 A1 5/2021 Yamamoto et al.

2021/0351021 A1 11/2021 Silveira et al.

2024/0203763 A1 6/2024 Chandrasekharan et al.

FOREIGN PATENT DOCUMENTS

JP 2003239074 A * 8/2003

KR 10-2018-0026079 A 3/2018

OTHER PUBLICATIONS

International Search Report and Written Opinion for Application No. PCT/US2025/014044 dated May 20, 2025.

Incropera, Frank P., et al., "Fundamentals of Heat and Mass Transfer", 5th Edition, John Wiley & Sons (4 pages).

* cited by examiner

*Primary Examiner* — Crystal L Hammond

*Assistant Examiner* — Samantha L Faubert

(74) *Attorney, Agent, or Firm* — Patterson + Sheridan, LLP

(57) ABSTRACT

A method and controller for processing substrates are described herein. In one example, a method of processing a substrate on a substrate support disposed on a cooling base comprises obtaining a temperature value at a bottom of the substrate support, obtaining a temperature value associated with the cooling base, determining a substrate temperature, and processing the substrate while disposed on the substrate support. The determined substrate temperature is based on, a thermal resistivity characteristic of the substrate support, the temperature value of the bottom of the substrate support, and the temperature value associated with the cooling base.

20 Claims, 4 Drawing Sheets

MODELING SUBSTRATE TEMPERATURES

BACKGROUND

Field

Embodiments of the present disclosure generally relate to a method and system for modeling substrate temperature for a process operation within a semiconductor processing chamber.

Description of the Related Art

Semiconductor chambers process substrates for a wide variety of applications, including the fabrication of integrated devices and micro-devices. The quality of the produced substrates may be temperature dependent. For example, many process recipes require an operation to initiate or cease upon obtaining a target substrate temperature. Failure to operate with a known substrate temperature may lead to poor production quality. However, obtaining an accurate substrate temperature continues to present challenges in the field. Many applications approximate the substrate temperature through measurement of an adjacent chamber component temperature within the chamber. This method of temperature estimation may lead to inaccurate substrate temperatures and yield product waste, poor uniformity, low yield, process drift, and longer periods of production downtime to resolve quality issues.

Therefore, there is a need for improved substrate temperature modeling within a processing chamber.

SUMMARY

A method and controller for processing substrates are described herein. In one example, a method of processing a substrate on a substrate support disposed on a cooling base comprises obtaining a temperature value at a bottom of the substrate support, obtaining a temperature value associated with the cooling base, determining a substrate temperature, and processing the substrate while disposed on the substrate support. The determined substrate temperature is based on, a thermal resistivity characteristic of the substrate support, the temperature value of the bottom of the substrate support, and the temperature value associated with the cooling base.

In another example, a non-transitory computer readable medium has stored instructions, which, when executed by a processor, causes the process to perform a method of processing a substrate on a substrate support disposed on a cooling base, wherein the method comprises obtaining a temperature value at a bottom of the substrate support, obtaining a temperature value associated with the cooling base, determining a substrate temperature, and processing the substrate while disposed on the substrate support. The determined substrate temperature is based on a thermal resistivity characteristic of the substrate support, the temperature value of the bottom of the substrate support, and the temperature value associated with the cooling base.

In another example, a controller that stores a non-transitory computer readable medium has stored instructions, which, when executed by a processor, causes the process to perform a method of processing a substrate on a substrate support disposed on a cooling base and wherein the method comprises obtaining a temperature value at a bottom of the substrate support, obtaining a temperature value associated with the cooling base, determining a substrate temperature, and processing the substrate while disposed on the substrate support. The determined substrate temperature is based on a thermal resistivity characteristic of the substrate support, the temperature value of the bottom of the substrate support, and the temperature value associated with the cooling base.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of the disclosure and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure is directed towards a method and system for modeling substrate temperature for process operations within a semiconductor processing chamber. In various examples, the substrate temperature model may be utilized to obtain an accurate temperature of the substrate through various temperature measurements and thermal resistivity characteristics of the substrate support. In one or more examples, the substrate temperature model uses a reading from a temperature probe within the substrate support. In one or more examples, the substrate temperature model uses a temperature reading from a temperature regulating fluid flowed within the substrate support. In one or more examples, the substrate temperature model uses a heater duty-cycle of a heater disposed within the substrate support.

The modeled substrate temperature enables process feedback readings, closed loop control which improves process operations, such as, but not limited to etch rate, ellipsometry of features, selectivity, etch depth in high aspect ratio features, chamber to chamber matching by adjusting for unit to unit variations, calibrations, such as, but not limited to, detection of changes in component bonding, thermal gaskets, and/or heaters, preventative maintenance, and temperature transient model and control. Therefore, the method and system disclosed below models an accurate substrate temperature that improves production quality, achieves accurate processing parameters, creates uniformity among process runs in a single chamber, achieves chamber to chamber uniformity, improves calibrations, and enables process control based on the substrate temperature.

Figure 1:
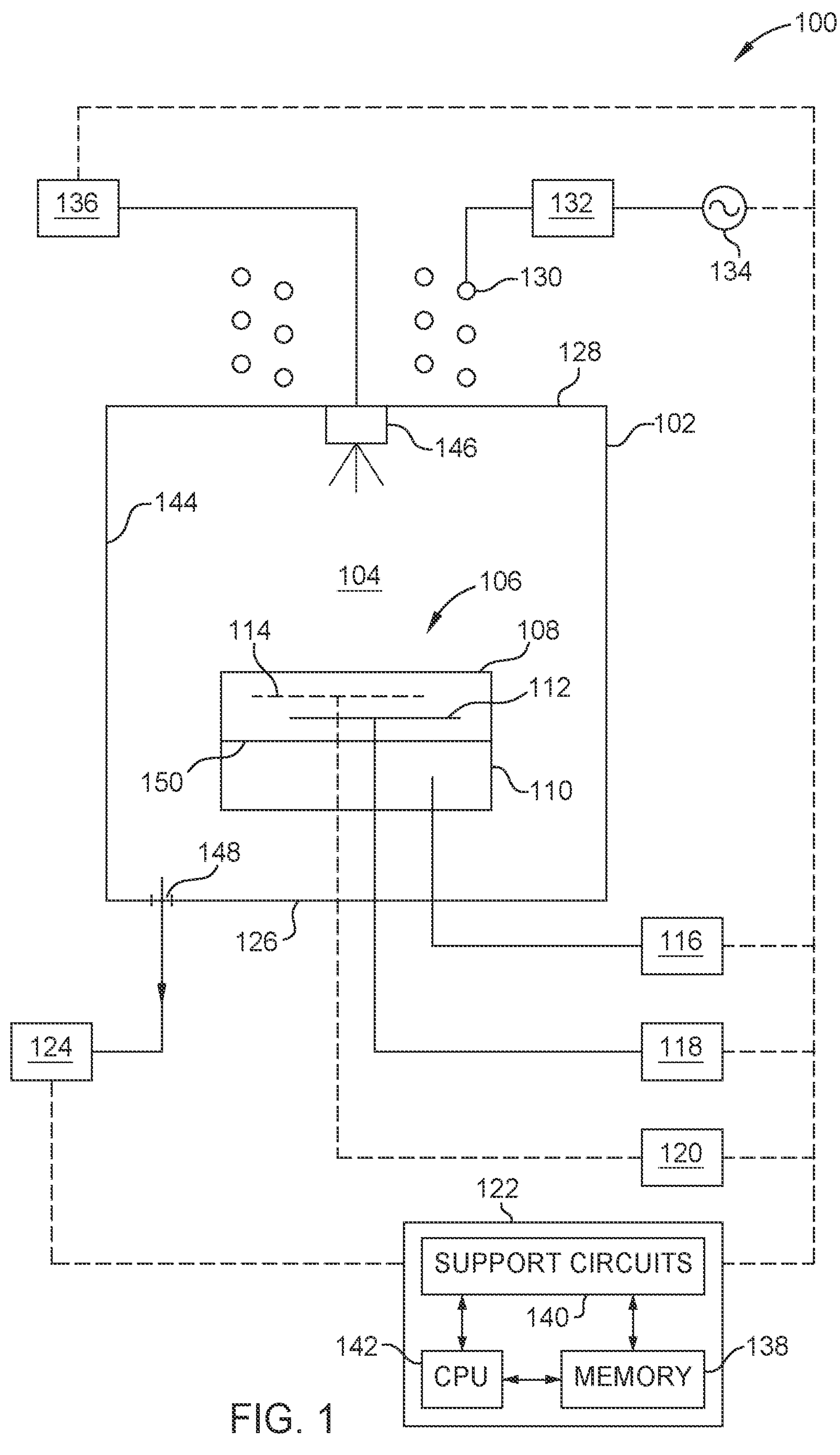
FIG. 1 is a schematic cross-sectional side view of a process chamber, according to embodiments of the present disclosure.

FIG. 1 is a cross-sectional schematic view of an exemplary plasma processing chamber 100, shown configured as an etch chamber, having a substrate support assembly 106. The processing chamber 100 is an example chamber that may be used to perform the method discussed in FIG. 4. The substrate support assembly 106 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface or workpiece, such as a substrate, at a cryogenic processing temperature is desirable.

The processing chamber 100 includes a chamber body 102 having chamber sidewalls 144, a chamber bottom 126 and a removably coupled lid 128 that enclose an inner volume 104. The chamber lid 128 is coupled to a gas panel 136 to allow gases to be provided into the inner volume 104 through an injection apparatus 146. In some examples, the gas panel 136 provides plasma, purging, cleaning, process, and/or additive gases to the inner volume 104. The chamber lid 128 also supports an RF coil 130. The RF coil 130 is energizable by an RF power supply 134. The RF power supply 134 provides RF power through a matching circuit 132 and to the RF coil 130. In some examples, the RF matching circuit 132 conditions the RF power to a suitable impedance to improve performance in the RF coil 130. In some examples, the energized RF coil 130 excites the plasma gases to create a plasma within the inner volume 104. Process gases, along with any processing by-products, are removed from the inner volume 104 through an exhaust port 148 formed in the chamber sidewalls 144 or chamber bottom 126 of the chamber body 102. The exhaust port 148 is coupled to a pumping system 124, which includes throttle valves and pumps utilized to control the vacuum levels within the inner volume 104.

The substrate support assembly 106 is disposed within the inner volume 104. The substrate support assembly 106 is configured to receive, support, and process a substrate thereon. In some examples, the substrate support assembly 106 comprises an electrostatic chuck 108 (also referred to as a substrate support) having bottom 150 and a cooling base 110. The electrostatic chuck 108 is configured to generate electrostatic forces to position a substrate (not shown) thereon. The electrostatic chuck 108 comprises a chucking electrode 114 that distributes bias power from a chucking electrode power supply 120 to generate the electrostatic forces for substrate positioning. The cooling base 110 is configured to remove thermal energy from the substrate support assembly 106. In some examples, the processing chamber 100 may be a cryogenic enabled chamber configured to reduce the temperature within the inner volume 104 to less than 0 degrees Celsius, such as 0 to −90 degrees Celsius.

In some examples, the electrostatic chuck 108 may have a heater 112 therein. The heater 112 generates thermal energy to regulate a temperature of the substrate support assembly 106. The heater 112 is coupled to a heater power supply 118. In some examples, the heater power supply 118 provides current to the heater 112 to create resistive thermal energy to regulate the temperature of the substrate support assembly 106. Conversely, the cooling base 110 is configured to flow a temperature regulating fluid therein. The cooling base 110 is coupled to a heat exchanger 116 to condition the temperature regulating fluid. In one example, the heat exchanger 116 may add or remove thermal energy from the temperature regulating fluid external to the chamber body 102 to condition the fluid for heat exchanging within the cooling base 110 internal to the chamber body 102.

A controller 122 is configured to receive data or input from sensor readings from a plurality of sensors and send or output instructions to various process chamber components or equipment. The controller 122 is equipped with or in communication with a system model (not shown) of the processing chamber 100. The system model is a program configured to estimate parameters (such as a gas flow rate, a gas pressure, a processing temperature, a rotational position of component(s), a heating profile, and/or a cleaning condition) within the processing chamber 100 throughout a processing operations and/or a cleaning operation. The controller 122 is further configured to store readings and calculations. The readings and calculations include previous sensor readings, such as any previous sensor readings within the processing chamber 100. The readings and calculations further include the stored calculated values from after the sensor readings are measured by the controller 122 and run through the system model. Therefore, the controller 122 is configured to both retrieve stored readings and calculations as well as save readings and calculations for future use. Maintaining previous readings and calculations enables the controller 122 to adjust the system model over time to reflect a more accurate version of the processing chamber 100.

The controller 122 can monitor, estimate an optimized parameter, adjust an initiated operation, generate an alert on a display, halt an operation, initiate a chamber downtime period, delay a subsequent iteration of an operation, initiate a cleaning operation, halt a cleaning operation, adjust a heating power, and/or otherwise adjust the process recipe.

The controller 122 includes a central processing unit (CPU) 142 (e.g., a processor), a memory 138 containing instructions, and support circuits 140 for the CPU 142. The controller 190 controls various items directly, or via other computers and/or controllers. In one or more examples, the controller 122 is communicatively coupled to at least the heat exchanger 116, the heater power supply 118, the chuck electrode bias power supply 120, the RF power supply 134, the gas panel 136, the pumping system 124, and auxillary chamber components (not shown) within the chamber body 102.

Figure 2:
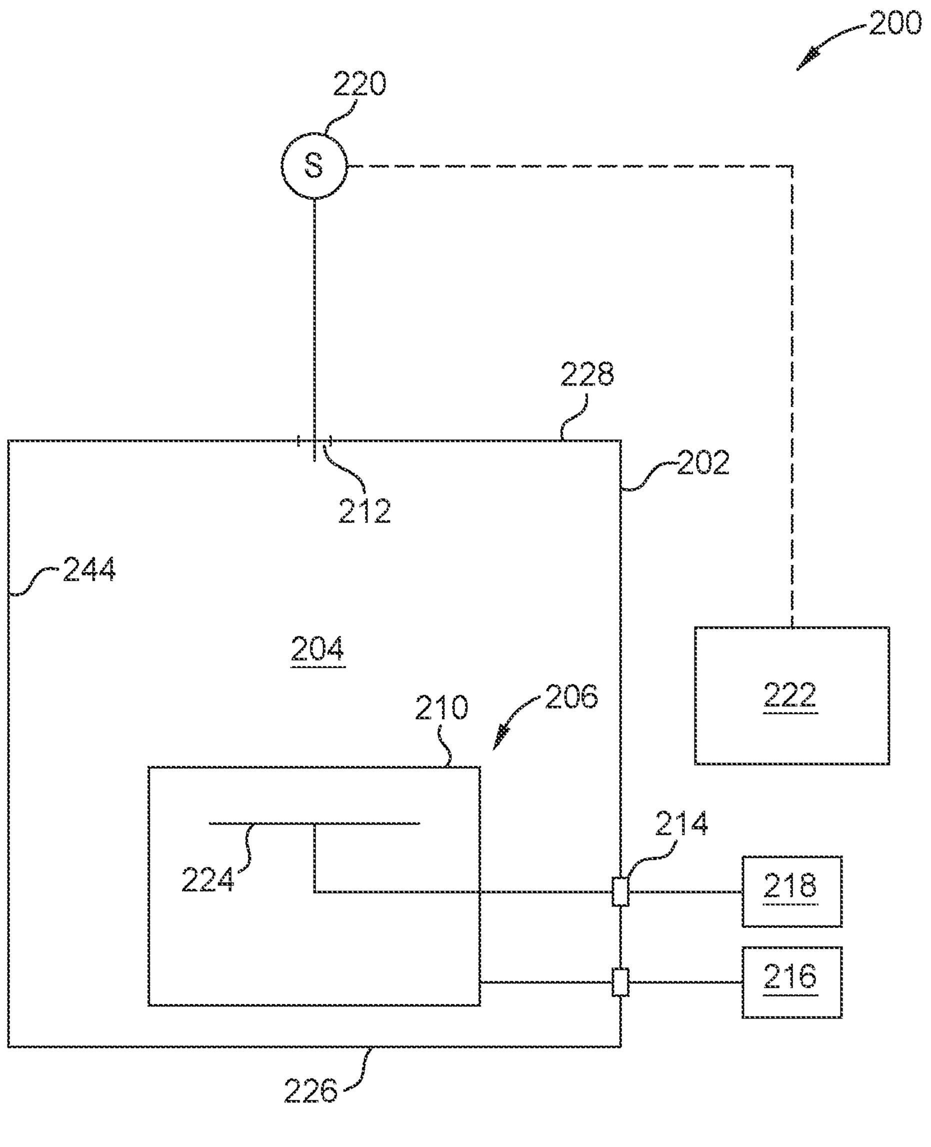
FIG. 2 is a schematic cross-sectional side view of a measurement chamber, according to embodiments of the present disclosure.

FIG. 2 is a cross-sectional schematic view of a measurement chamber 200. The measurement chamber 200 comprises a chamber body 202 having a chamber bottom 226 disposed below a chamber sidewall 244. A chamber lid 228 is removably coupled to the chamber sidewall 244 of the chamber body 202 to define a processing volume 204 with a removable testing substrate support assembly 206 disposed therein. The testing substrate support assembly 206 is a functioning component that is removable for transfer to and positioning into a processing chamber 100. For example, the measurement chamber 200 is configured to receive a testing substrate support assembly 206, such as the substrate support assembly 106 from FIG. 1, to perform analytics on the substrate support assembly 106 before or after the substrate support assembly 106 is utilized for processing. The measurement chamber 200 is advantageous as the measurement chamber 200 may be a portable chamber configured to be transported from an area to another area, such as an area near the processing chamber 100 to another area near another processing chamber. In some examples, the measurement chamber 200 is utilized as a testing type chamber to measure specific data from a component within.

Referring back to FIG. 2, the chamber lid 228 has a view port 212 that provides a line of sight for a sensing device 220 to measure the temperature of the top surface 210 of the testing substrate support assembly 206. The sensing device 220 is capable of an accurate temperature determination of the top surface 210 of the testing substrate support assembly 206. The sensing device 220 may be an optical probe to sense the top surface 210 temperature. In some examples, the sensing device 220 is an optical probe such as a non-contacting etalon sensor as disclosed in U.S. Pat. No. 11,280,686 B2 and U.S. Patent Application No.: 20230102821A1, which are herein incorporated by reference. In some examples, the sensing device 220 is communicatively coupled to a controller 222. In those examples, the temperature reading obtained from the sensing device 220 is stored in the controller 222 to be used for later described calculations. The controller 222 may be a separate controller 222 as compared to the controller 122 discussed in FIG. 1. Further, the controller 222 may communicate with the controller 122. In other examples, the controller 222 is the controller 122 of FIG. 1.

The measurement chamber 200 may also contain connectors 214 that are configured to couple the testing substrate support assembly 206 to at least a heater power supply 218 and a heat exchanger 216 similar to the configuration of FIG. 1. In some examples, the heater power supply 118 and the heat exchanger 116 of FIG. 1 are coupled to the connectors 214.

In operation, the measurement chamber 200 is able to regulate the temperature of the testing substrate support assembly 206 to measure calibration data. This is advantageous as the calibration data in a controlled environment, such as the measurement chamber 200, may be compared to data from a live operating processing chamber 100.

Figure 3:
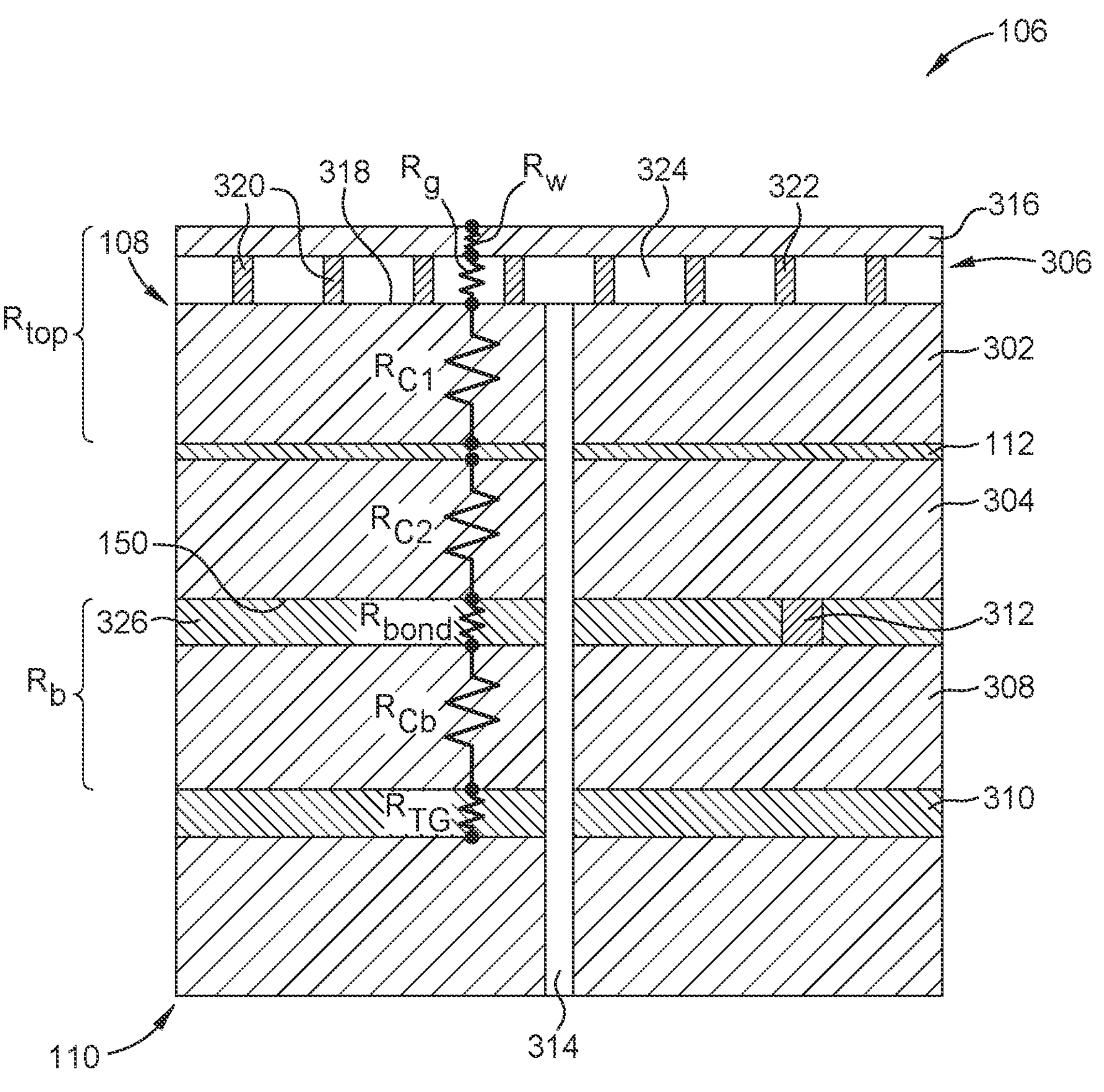
FIG. 3 is an expanded cross-sectional view of the substrate support assembly from FIG. 1, according to one embodiment of the present disclosure.

FIG. 3 is an expanded cross-sectional view of the substrate support assembly 106. The substrate support assembly 106 comprises the electrostatic chuck 108 bonded to a backing plate 308 by a bond layer 326. The backing plate 308 is coupled to the cooling base 110 by a thermal gasket 310. The electrostatic chuck 108 comprises the heater 112 disposed between an upper heater ceramic 302 and a lower heater ceramic 304. The upper heater ceramic 302 is disposed above the heater 112. The lower heater ceramic 304 is disposed below the heater 112. The electrostatic chuck 108 has a top surface 318. In some examples, the electrostatic chuck 108 has a mesa 306 disposed on the top surface 318. In some examples, the mesa 306 may be a single layer. In other examples, the mesa 306 may be structured with gratings 320 utilized to suspend a substrate 316 above the top surface 318. In those examples, the gratings 320 may be configured to support a substrate 316 through various substrate contact points 322 of the grating 320. The contact points 322 of the grating 320 may be spaced apart creating a void space 324 between the gratings 320 and between the substrate 316 and the top surface 318. In some examples, a gas is supplied to the void space 324 through the backside gas supply tube 314.

The bond layer 326 contains a temperature sensing probe 312 disposed therein. The temperature sensing probe 312 is configured to measure a temperature of the bottom 150 of the electrostatic chuck 108. While not shown, the temperature sensing probe 312 is coupled to the controller 122.

In operation, the controller 122 may initiate the heater 112 to heat the substrate support assembly 106 to achieve a desired substrate 316 temperature. The heater 112 provides thermal energy that radiates into the upper heater ceramic 302 and into the lower heater ceramic 304 to heat the electrostatic chuck 108. The thermal energy that radiates across the lower heater ceramic 304 creates a thermal profile across the lower heater ceramic 304. The temperature sensing probe 312, abutted to the lower heater ceramic 304 of the electrostatic chuck 108, is positioned to sense the thermal energy from the lower heater ceramic 304 thereby providing a temperature value of at least the temperature of the electrostatic chuck affected by the heater 112. In addition or alternatively, a plasma from within the inner volume 104 of the processing chamber 100 may also exert thermal energy downward onto the substrate support assembly 106 and eventually to the bottom 150. In that example, the temperature sensing probe 312 will measure a temperature value of at least the thermal energy effect of the plasma through the electrostatic chuck 108. In some examples, the temperature sensing probe 312 can obtain a temperature value at the bottom 150 of both the thermal energies of the heater 112 and the plasma.

Conversely, the controller 122 may initiate the cooling base 110 to cool the substrate support assembly 106 to achieve a desired substrate 316 temperature. As mentioned above, the cooling base 110 is configured to flow a temperature regulating fluid that is conditioned in the heat exchanger 116. The temperature regulating fluid may be cooled to a cryogenic temperature and provide that thermal energy to the substrate support assembly 106 to balance or overcome the thermal energy of, for example, the heater 112 and the plasma, depending on the desired substrate 316 temperature.

Figure 4:
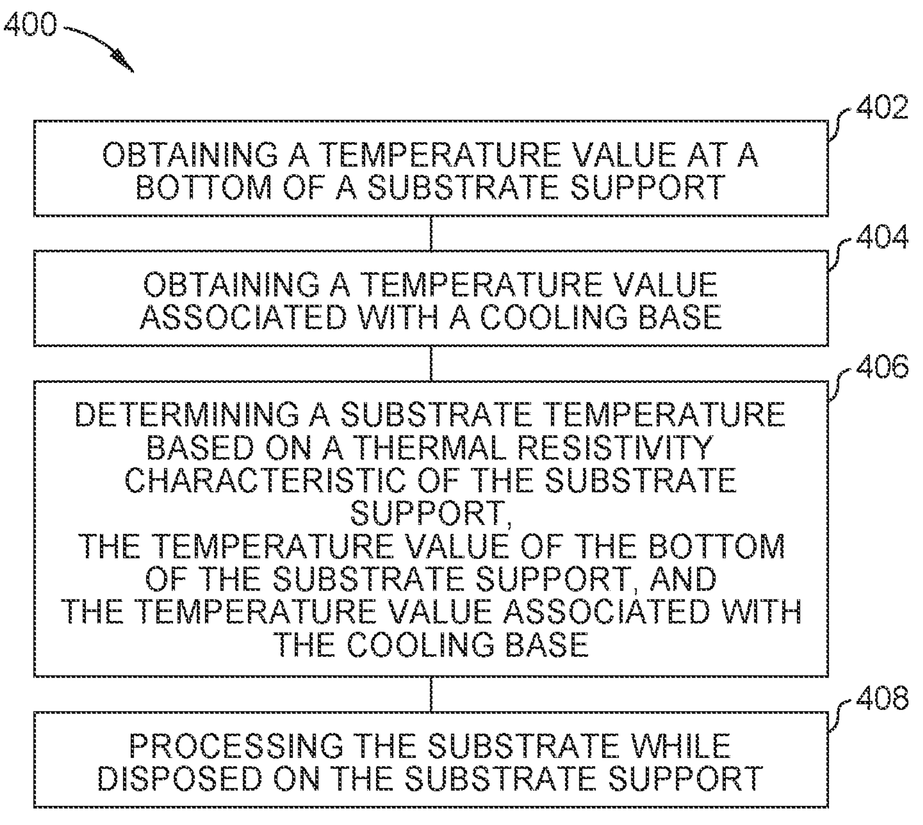
FIG. 4 is an exemplary block diagram of a method for modeling a substrate temperature, according to embodiments of the present disclosure.

FIG. 4 is a block diagram of a method 400 illustrating operations for modeling a substrate temperature. The method 400 of FIG. 4 may be performed for calibration and real-time calculation of the substrate temperature within the chambers of FIG. 1 and/or FIG. 2. The method 400 comprises operation 402, operation 404, operation 406, and operation 408.

Operation 402 is an operation to obtain a temperature value at a bottom of the substrate support. As discussed above, the temperature sensing probe 312 may be utilized to obtain the temperature of the electrostatic chuck 108 as various thermal energies are exerted onto the substrate support assembly 106.

The temperature sensing probe 312 can be of various types of temperature sensing equipment including, but not limited to, resistance temperature detectors (RTD) or thermocouples. In some examples, the temperature sensing probe 312 may be embedded within the bond layer 326. In some examples, the temperature sensing probe 312 may be disposed directly in physical contact with the bottom 150 of the electrostatic chuck 108 to enable accurate measurement. In some examples, the temperature sensing probe 312 may be disposed closer to the cooling base 110 than bottom 150 of the electrostatic chuck 108 to measure the bond layer temperature profile along with the electrostatic chuck 108 measurement. While the temperature sensing probe 312 is depicted as a single point of measurement unit, the temperature sensing probe 312 may comprise multiple points of sensing. In some examples, the temperature sensing probe 312 may be an elongated sensing device to capture the temperature measurement across the length of the bottom 150 of the electrostatic chuck 108. In some examples, a plurality of temperature sensing probes, as represented by the temperature sensing probe 312, may be utilized to measure the temperature at multiple points along the surface of the bottom 150 of the electrostatic chuck 108.

The temperature sensing probe 312 is configured to provide a temperature measurement of up to about −100 degrees Celsius to about 400 degrees Celsius. In some examples, as discussed above, the temperature sensing probe 312 is configured to relay the temperature measured to the controller 122. In some examples, the controller 122 may compute the average temperature measured across multiple probes on the bottom 150 of the electrostatic chuck 108.

Operation 404 is an operation to obtain a temperature value associated with the cooling base 110. As discussed above, the cooling base 110 may provide thermal energy to regulate the temperature of the substrate support assembly 106.

In some examples, the cooling base 110 comprises flow paths within that flow the temperature regulating fluid within to provide thermal energy to the substrate support assembly 106. The thermal regulating fluid may be conditioned by the external heat exchanger 116. In some examples, the heat exchanger 116 may be a plate heat exchanger, a shell and tube heat exchanger, or the like, capable of conditioning the temperature regulating fluid to a temperature of about −100 degrees Celsius to about 400 degrees Celsius.

In some examples, the temperature of the cooling base may be measured directly from the temperature regulating fluid entering the chamber 100, 200. In those examples, the temperature may be obtained from a temperature sensing device (not shown) positioned between an outlet of the heat exchanger 116 and an inlet of the cooling base 110. In some examples, the temperature may be obtained from a temperature sensing device (not shown) positioned between an outlet of the cooling base 110 and inlet of the heat exchanger 116 for steady state measurement. In other examples, the temperature of the cooling base 110 may be obtained from a temperature device disposed within the cooling base 110, similar to the temperature sensing probe 312. In some examples, the temperature of the cooling base 110 may be obtained from within the heat exchanger 116 measuring the temperature regulating fluid flowing towards the cooling base 110, such as on the fluid conduit coupling the heat exchanger 116 and the cooling base 110.

The temperature associated to the cooling base 110, obtained from a method discussed above, is provided to the controller 122. In some examples, the controller 122 may compute the average temperature in examples where multiple temperatures are measured associated with the cooling base 110.

Operation 406 is an operation to determine a substrate temperature based on thermal resistivity characteristics of the electrostatic chuck 108, the temperature value at the bottom of the substrate support, and the temperature value associated with the cooling base 110.

As mentioned above, the temperature value at the bottom of the substrate support (or electrostatic chuck), is provided to, for example, the controller 122 as an input into Equation 1 shown below. Similarly, the temperature value associated with the cooling base 110 is provided to, for example, the controller 122 as an input into Equation 1 shown below.

The temperature of the substrate 316 may be calculated using Equation 1. Equation 1 is utilized to accurately model the temperature of the substrate 316 within a temperature range of about 0.1 to about 5 degrees Celsius, such as about 1 to about 4 degrees Celsius, such as about 1 to about 3 degrees Celsius, such as about less 2.8 degrees Celsius from the true substrate temperature.

$$T_W = T_{pr}\left(\frac{R_{top}+R_{c2}}{R_b}+1\right) - T_{cb}\left(\frac{R_{top}+R_{c2}}{R_b}\right) - qR_{top} \qquad \text{Equation 1}$$

wherein:

$T_w$=Substrate 316 temperature [Kelvin]

$T_{pr}$=Probe 312 temperature [Kelvin]

$R_{top}$=Thermal resistance across the substrate 316, mesa 306, and the upper heater ceramic 302 [K/W]

$R_{c2}$=Thermal resistance of the lower heater ceramic 304 [K/W]

$R_b$=Thermal resistance across the bond layer 326 and the backing plate 308 [K/W]

$T_{cb}$=Temperature of cooling base 110 [Kelvin]

q=Overall heat transfer rate generated by the RF power 134 and the heater 112 [W]

Referring back to FIG. 3, the thermal resistivities within Equation 1 are illustrated. $R_{top}$ is the combination of the thermal resistance across the substrate 316, mesa 306, and the upper heater ceramic 302. $R_{c2}$ is the thermal resistance of the lower heater ceramic 304. $R_b$ is the thermal resistance across the bond layer 326 and the backing plate 308. In order to facilitate understanding, the thermal resistivity may be calculated from performing a calibration operation within a measuring chamber with the ability to accurately measure the temperature of the substrate 316, such as the measurement chamber of FIG. 2.

For example, the substrate support assembly 106 shown in FIG. 3 may be positioned within the measurement chamber of FIG. 2 with a sensing device 220 to measure the temperature of the substrate 316 or the top surface 210. In some examples, the substrate 316 thermal resistivity is a known value and does not need to be measured for the calculation of $R_{top}$. In other words, the known resistivity of the substrate may be input into the controller 222 for incorporation into the value of $R_{top}$. The substrate support assembly 206 is coupled to the heater power supply 218 and the heat exchanger 216 via the connectors 214. The heater 224, within the substrate support assembly 206, provides a known or calibrated rate of heat energy to the substrate support assembly 206. In some examples, the heat exchanger 216 provides a known or calibrated rate of heat energy to the substrate support assembly 206. The temperature of the substrate 316 or the top surface 210 is measured by the sensing device 220 to provide a value for $T_w$ Of Equation 1. Next, Equation 2 and Equation 3 may be utilized to determine the thermal resistivity of $R_{top}$ by use of Equation 1 using the known calibration values used for each $R_{c2}$ and $R_b$, otherwise known as zones.

$$R_b = \frac{T_{pr} - T_{cb}}{q} \qquad \text{Equation 2}$$

wherein:

$R_b$=Thermal resistance across the bond layer 326 and the backing plate 308 [K/W]

$T_{pr}$=Probe temperature [Kelvin]

$T_{cb}$=Temperature of cooling base 110 [Kelvin]

q=Heat transfer rate [W]

$$R_{C2} = \frac{T_w - T_{pr}}{q} \qquad \text{Equation 3}$$

wherein:

$R_{c2}$=Thermal resistance of the lower heater ceramic 304 [K/W]

$T_w$=Substrate 316 temperature [Kelvin]

$T_{pr}$=Probe 312 temperature [Kelvin]

q=Overall heat transfer rate generated by the heater 224 and the exchanger 216 [W]

In some examples, multiple calculated values from the above equations may be provided to the model to enable accuracy. For example, the calibrated rate of heat energy may be altered in the calculation of $R_{top}$. Various scenarios may be performed to provide different data points for any of the thermal resistivity characteristics. These measured or calculated values may be plotted by the controller 222 to perform a fit operation, such as a polynomial fit, or a linear fit, to obtain the absolute, average, or standard deviation of the dataset. Further, the model may extrapolate, or interpolate, values to obtain an accurate resistivity $R_{top}$, $R_{c2}$, and/or $R_b$. The benefit of this method of obtaining these thermal resistivity characteristics, as discussed above, is that no dimensional measurement of the substrate support architecture is required. Rather, the architecture is measured to obtain an accurate thermal resistivity. This method enables various substrate support architectures to be measured for analysis and is not limited to the structure of the substrate support assemblies 106, 206, as illustrated in FIGS. 1-3.

Once $R_{top}$ is determined, the substrate support assembly 106 is positioned in the processing chamber 100 for processing substrates. In a non-plasma processing operation, the controller 122 is now able to accurately model the temperature of the substrate positioned on the electrostatic chuck 108. In a plasma processing operation, the controller 122 is able to accurately model the temperature of the substrate positioned on the electrostatic chuck 108 with an adjustment to account for the thermal energy exerted on to the substrate support assembly 106 from the plasma. For example, $R_{top}$ can be calibrated in a processing chamber 100 with the use of Equation 4.

$$R_{top} = \frac{\frac{R_{c2}}{R_b}(T_{pr} - T_{cb}) + T_{pr} - T_w}{q + \frac{T_{cb} - T_{pr}}{R_b}} \qquad \text{Equation 4}$$

wherein:

$T_w$=Substrate 316 temperature [Kelvin]

$T_{pr}$=Probe 312 temperature [Kelvin]

$R_{top}$=Thermal resistance across the substrate 316, mesa 306, and the upper heater ceramic 302 [K/W]

$R_{c2}$=Thermal resistance of the lower heater ceramic 304 [K/W]

$R_b$=Thermal resistance across the bond layer 326 and the backing plate 308 [K/W]

$T_{cb}$=Temperature of cooling base 110 [Kelvin]

q=Overall heat transfer rate [W]

The overall heat transfer rate, q, may be equal to the rate of the thermal energy of the plasma minus the known heat transfer rate, from the processing operation. Therefore, the temperature of the substrate model accounts for processing thermal energies that exist within a processing chamber 100 but may not exist in a measurement chamber 200 to obtain a processing $R_{top}$. The benefit of further calibrating $R_{top}$ for processing conditions is that the thermal duty of the heater 112 may be actively controlled to account for other thermal energies within the processing chamber 100.

The above exemplary model illustrates the use of a specific chamber architecture, however the model may be use on several different type of chambers with different structures within to obtain their respective thermal resistivity characteristic. For example, other thermal resistivity characteristics may be analyzed to be incorporated into the model. In some examples, a backside gas may be provided to the mesa 306 through the backside gas supply tube 314 to fill the void space 324. Each backside gas may by analyzed for their respective thermal resistivity characteristics at differing pressures. Therefore, the model can be further improved by incorporating the additional resistivity of the backside gas used during processing within the substrate support assembly 106.

Referring back to operation 406, the substrate 316 temperature, based on the thermal resistivity characteristics of the electrostatic chuck 108, the temperature value at the bottom of the substrate support, and the temperature value associated with the cooling base 110, may be determined.

Operation 408 is an operation that processes the substrate disposed on the substrate support by using the above mentioned determined substrate temperature.

Many processing recipes may use processing steps/operations specifically tailored to change upon achieving target substrate temperatures or may require specific substrate temperatures for better processing conditions. In some examples, the process recipe may require raising the temperature of the substrate for better processing, for example etch, or deposition, requiring the heater 112 to provide the thermal energy to a target duty. The model provides the substrate temperature real-time to provide better control of the heater 112. While the heater 112 is used in the mentioned example, various equipment that provide thermal energies may be used for better control of the equipment. By obtaining an accurate substrate temperature, processing recipes may be exacted to minimize waste and produce higher quality processed substrates.

In some examples, operation 408 is improved by the accuracy of the substrate temperature as control schemes may be implemented. For example, closed loop control is achievable by incorporating the model, discussed above, into the control system of the processing chamber 100. In some examples, the cooling base 110 may be controlled based on the target substrate temperature while accounting for various thermal energies existing within the processing chamber 100 to achieve a target substrate temperature. In some examples, the heater 112 duty may be controlled to account for any irregularities that may occur within the processing chamber 100 from, for example, a temperature regulating fluid temperature drift, or plasma density irregularities.

Figure 5:
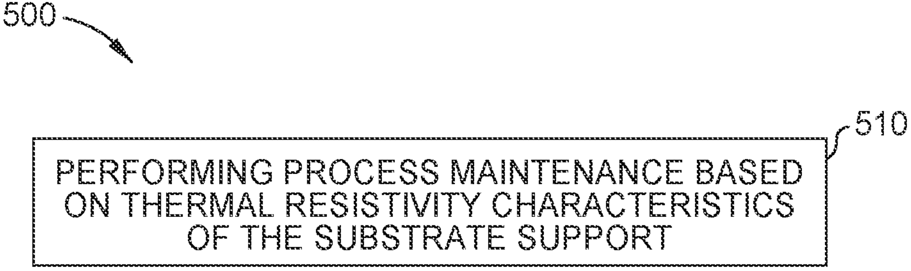
FIG. 5 is an exemplary block diagram of a method for performing process maintenance based on thermal resistivity characteristics of the substrate support, according to embodiments of the present disclosure.

Now referring to FIG. 5 which is a block diagram of a method 500 illustrating operations for performing process maintenance based on thermal resistivity characteristics via operation 510.

Operation 510 performs process maintenance based on thermal resistivity characteristics of the substrate support assembly 206. As mentioned above, the thermal resistivity characteristics may be determined for any substrate support assembly 206. A data log may be recorded, logged, and maintained to provide information of the specific substrate support assembly 206. For example, a data log may be obtained from the calculated resistivies of a substrate support assembly before processing. The calculated resistivities may later be compared to the same substrate support assembly, after a predetermined number of processing cycles, to determine if the thermal resistivity characteristics have changed. If the thermal resistivity characteristics have changed, the substrate support may be in need of maintenance. Changes determined in the thermal resistivity characteristics may indicate that features within the substrate support are failing, wearing, or deteriorated.

In some examples, the change in thermal resistivity characteristics may be obtained within a processing chamber 100 through calculation of the substrate temperature. For example, a change in substrate temperature while operating at steady state indicates a thermal resistivity characteristic change. The obtained thermal resistivity characteristic change may indicate real-time process drift caused by a malfunctioning component within the substrate support.

Calibrations may be performed real-time as well as performed by comparing values after processing in a measurement chamber 200. Since the controller 222 may be configured to obtain, store, and evaluate temperature readings from the sensing device 220, the controller 222, through use of a processor, may establish a data trend line and alert deviation from desired process conditions.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate on a substrate support disposed on a cooling base, the method comprising:
- obtaining a temperature value at a bottom of the substrate support;
- obtaining a temperature value associated with the cooling base;
- determining a substrate temperature based on:
  - a thermal resistivity characteristic of the substrate support comprising a plurality of thermal resistances across a plurality of layers of the substrate support,
  - the temperature value of the bottom of the substrate support, and
  - the temperature value associated with the cooling base; and
- processing the substrate while disposed on the substrate support based on the substrate temperature.

2. The method of claim 1, wherein determining the substrate temperature is further based on a temperature value of a backside gas configured to flow under a backside of the substrate.

3. The method of claim 1, wherein obtaining the temperature value at a bottom of the substrate support is obtained from a temperature probe disposed on a backside of an electrostatic chuck.

4. The method of claim 1, wherein the temperature value associated with the cooling base is obtained from a temperature measurement device coupled to a temperature regulating fluid configured to flow through the cooling base.

5. The method of claim 1, wherein determining the substrate temperature is further based on a rate of heat transfer of a substrate support heater.

6. The method of claim 1, wherein the substrate temperature is determined by:

$$T_W = T_{pr}\left(\frac{R_{top} + R_{c2}}{R_b} + 1\right) - T_{cb}\left(\frac{R_{top} + R_{c2}}{R_b}\right) - qR_{top}$$

wherein:

$T_w$=the substrate temperature [Kelvin]

$T_{pr}$=a probe temperature measuring a temperature value at a bottom of the substrate support [Kelvin]

$R_{top}$=a first thermal resistance across the substrate, a mesa, and a upper heater ceramic of the substrate support [K/W]

$R_{c2}$=a second thermal resistance of a lower heater ceramic of the substrate support [K/W]

$R_b$=a third thermal resistance across a bond layer and a backing plate of the substrate support [K/W]

$T_{cb}$=a temperature measurement of the cooling base [Kelvin]

q=an overall heat transfer rate [W].

7. The method of claim 1, wherein the plurality of thermal resistances are associated with an upper heater ceramic, a lower heater ceramic, and a bond layer.

8. The method of claim 1, wherein the thermal resistivity characteristic of the substrate support is determined based on calibration measurements of the substrate support performed prior to processing the substrate.

9. The method of claim 1, wherein the determined substrate temperature is used in a closed loop control to process the substrate.

10. A non-transitory computer readable medium has stored instructions, which, when executed by a processor, causes the processor to perform a method of processing a substrate on a substrate support disposed on a cooling base in a processing chamber, the method comprising:
- obtaining a temperature value at a bottom of the substrate support;
- obtaining a temperature value associated with the cooling base;
- determining a substrate temperature based on:
  - a thermal resistivity characteristic of the substrate support comprising a plurality of thermal resistances across a plurality of layers of the substrate support,
  - the temperature value of the bottom of the substrate support, and
  - the temperature value associated with the cooling base; and
- processing the substrate while disposed on the substrate support based on the substrate temperature.

11. The method of claim 10, wherein determining the substrate temperature is further based on a temperature value of a backside gas configured to flow under a backside of the substrate.

12. The method of claim 10, wherein the temperature value at a bottom of the substrate support is obtained from a temperature probe disposed on a backside of an electrostatic chuck.

13. The method of claim 10, wherein determining the substrate temperature is further based on a duty value of a substrate support heater.

14. The method of claim 10, wherein the plurality of thermal resistances are associated with an upper heater ceramic, a lower heater ceramic, and a bond layer.

15. The method of claim 10, wherein the determined substrate temperature is used in a closed loop control to process the substrate.

16. A controller that stores a non-transitory computer readable medium has stored instructions, which, when executed by a processor, causes the processor to perform a method of processing a substrate on a substrate support disposed on a cooling base in a processing chamber, the method comprising:
- obtaining a temperature value at a bottom of the substrate support;

obtaining a temperature value associated with the cooling base;

determining a substrate temperature based on:

a thermal resistivity characteristic of the substrate support comprising a plurality of thermal resistances across a plurality of layers of the substrate support, the temperature value of the bottom of the substrate support, and the temperature value associated with the cooling base; and processing the substrate while disposed on the substrate support based on the substrate temperature.

17. The method of claim 16, wherein determining the substrate temperature is further based on a temperature value of a backside gas configured to flow under a backside of the substrate.

18. The method of claim 16, wherein the temperature value at a bottom of the substrate support is obtained from a temperature probe disposed on a backside of an electrostatic chuck.

19. The method of claim 16, wherein determining the substrate temperature is further determined based on a rate of heat transfer of a substrate support heater.

20. The method of claim 16, wherein the substrate temperature is determined by:

$$T_W = T_{pr}\left(\frac{R_{top} + R_{c2}}{R_b} + 1\right) - T_{cb}\left(\frac{R_{top} + R_{c2}}{R_b}\right) - qR_{top}$$

wherein:

$T_w$=the substrate temperature [Kelvin]

$T_{pr}$=a probe temperature measuring a temperature value at a bottom of the substrate support [Kelvin]

$R_{top}$=a first thermal resistance across the substrate, a mesa, and a upper heater ceramic of the substrate support [K/W]

$R_{c2}$=a second thermal resistance of a lower heater ceramic of the substrate support [K/W]

$R_b$=a third thermal resistance across a bond layer and a backing plate of the substrate support [K/W]

$T_{cb}$=a temperature measurement of the cooling base [Kelvin]

q=an overall heat transfer rate [W].

* * * * *